(12) United States Patent
Yamaguchi et al.

(10) Patent No.: US 8,633,775 B2
(45) Date of Patent: *Jan. 21, 2014

(54) METHOD OF MANUFACTURING PIEZOELECTRIC VIBRATOR, PIEZOELECTRIC VIBRATOR, OSCILLATOR, ELECTRONIC EQUIPMENT AND RADIO-CONTROLLED TIMEPIECE

(75) Inventors: Yumi Yamaguchi, Chiba (JP);
Kazuyoshi Sugama, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 272 days.

This patent is subject to a terminal disclaimer.

(21) Appl. No.: 13/035,519

(22) Filed: Feb. 25, 2011

(65) Prior Publication Data

US 2011/0140795 A1 Jun. 16, 2011

Related U.S. Application Data

(63) Continuation of application No. PCT/JP2008/065247, filed on Aug. 27, 2008.

(51) Int. Cl.
*H03H 9/24* (2006.01)
*H01L 41/053* (2006.01)
*H03B 5/32* (2006.01)

(52) U.S. Cl.
USPC ............... 331/156; 310/344; 29/25.35

(58) Field of Classification Search
USPC .................... 331/156; 310/344
See application file for complete search history.

(56) References Cited

U.S. PATENT DOCUMENTS 3,766,616 A * 10/1973 Staudte .................. 29/25.35
6,924,582 B2 * 8/2005 Shimizu et al. ............ 310/312
8,087,135 B2 * 1/2012 Ouchi et al. ............. 29/25.35

FOREIGN PATENT DOCUMENTS

| JP | 06-081132 U | 11/1994 |
| JP | 2003-142976 A | 5/2003 |
| JP | 2006-033354 A | 2/2006 |
| JP | 2006-086585 A | 3/2006 |
| JP | 2007-251238 A | 9/2007 |
| WO | WO 2005/050736 A1 | 6/2005 |

OTHER PUBLICATIONS

International Search Report for International Application No. PCT/JP2008/065247, dated Nov. 25, 2008, 2 pages.

* cited by examiner

*Primary Examiner* — Joseph Chang
(74) *Attorney, Agent, or Firm* — Brinks Gilson & Lione

(57) ABSTRACT

Provided is a method of manufacturing a piezoelectric vibrator of the invention, the piezoelectric vibrator including a tuning fork type piezoelectric vibrating reed including a pair of vibration arm portions, a package that accommodates the piezoelectric vibrating reed, and a pair of regulation films that is formed along a longitudinal direction of the vibration arm portions corresponding to each of the pair of vibration arm portions, the piezoelectric vibrator being capable of regulating a degree of vacuum in the package more than a certain level by irradiating the regulation films with a laser to evaporate a part of the regulation films. The method includes a gettering process of irradiating a laser in symmetrical positions via a center axis of the pair of vibration arm portions in the pair of regulation films.

5 Claims, 16 Drawing Sheets

METHOD OF MANUFACTURING PIEZOELECTRIC VIBRATOR, PIEZOELECTRIC VIBRATOR, OSCILLATOR, ELECTRONIC EQUIPMENT AND RADIO-CONTROLLED TIMEPIECE

RELATED APPLICATIONS

This application is a continuation of PCT/JP2008/065247 filed on Aug. 27, 2008. The entire content of this application is incorporated herein by reference.

TECHNICAL FIELD

The present invention relates to a Surface Mount Device (SMD) type piezoelectric vibrator in which a piezoelectric vibrating reed is sealed in a cavity formed between two bonded substrates, a piezoelectric vibrator manufacturing method to manufacture the same, an oscillator, electronic equipment and a radio-controlled timepiece having the piezoelectric vibrator.

BACKGROUND ART

In recent years, piezoelectric vibrators using crystals or the like have been used in mobile phones or personal digital assistants, as a time source or a timing source such as a control signal, or a reference signal source and the like. Various types of piezoelectric vibrators are known. As one of them, a Surface Mount Device (SMD) type piezoelectric vibrator is known.

FIG. 18 is a plane view of a state in which a lid substrate of a piezoelectric vibrator according to the related art is removed, and FIG. 19 is a cross-sectional view taken from line D-D of FIG. 18. As shown in FIG. 19, as an SMD type piezoelectric vibrator 200, a piezoelectric vibrator, in which a package 209 is formed by a base substrate 201 and a lid substrate 202, and a piezoelectric vibrating reed 203 that is received in a cavity C formed in an inner portion of the package 209, is suggested. The base substrate 201 and the lid substrate 202 are bonded to each other by anode-bonding by arranging a bonding film 207 therebetween.

It is generally desirable with piezoelectric vibrators that the equivalent resistance values (effective resistance value, Re) of the piezoelectric vibrator are suppressed to a lower level. Since piezoelectric vibrators with low equivalent resistance values can vibrate the piezoelectric vibrating reed using less electric power, they are more energy efficient piezoelectric vibrators.

As one of the common methods of suppressing the equivalent resistance value, there is known a method of making an inner portion of the cavity C with the piezoelectric vibrating reed 203, as shown in FIG. 18, sealed therein closer to a vacuum, thereby lowering a series resonance resistance value (R1) that is in a proportional relationship with the equivalent resistance value. As a method of making the inner portion of the cavity C closer to a vacuum, there is known a method (gettering) of sealing a getter material 220 formed of aluminum or the like in the cavity C and irradiating a laser from the outside to activate the getter material 220 (see Patent Documents 1 and 2). According to this method, since the oxygen generated at the time of anode-bonding can be absorbed by the getter material 220 entering the activation state, the inner portion of the cavity C can be made closer to a vacuum.
Patent Citation 1: JP-A-2006-86585
Patent Citation 2: JP-T-2007-511102

SUMMARY OF THE INVENTION

Technical Problem

However, when gettering the piezoelectric vibrator 200 with the tuning fork type piezoelectric vibrating reed 203 shown in FIG. 18 mounted thereon, the getter material 220 and the products due to the gettering are attached to a vibration arm portion 210 of a piezoelectric vibrating reed 203 situated just near the getter material 220. At this time, when the amount of the getter material 220, which is attached to the pair of vibration arms portions 210 and 210, respectively, is unbalanced, a vibration leakage (leakage of vibration energy) occurs, whereby the property of the piezoelectric vibrator becomes unstable. As a result, there is a problem in that the throughput of the piezoelectric vibrator 200 declines.

Thus, the invention is made in view of the above circumstances, and an object thereof is to provide a piezoelectric vibrator that can reduce the vibration leakage to improve the throughput, a method of producing the same, an oscillator, electronic equipment and a radio-controlled timepiece.

Technical Solution

The invention provides the following means to solve the above-mentioned problem:

According to the invention, there is provided a method of manufacturing a piezoelectric vibrator which includes a tuning fork type piezoelectric vibrating reed including a pair of vibration arm portions, a package that accommodates the piezoelectric vibrating reed, and a pair of regulation films that is formed along a longitudinal direction of the vibration arm portions corresponding to each of the pair of vibration arm portions, and is capable of regulating a degree of vacuum in the package to more than a certain level by irradiating the regulation films with a laser to evaporate a part of the regulation films, the method having a gettering process of irradiating a laser in a symmetrical position via a center axis of the pair of vibration arm portions in the pair of regulation films.

A piezoelectric vibrator according to the invention includes a tuning fork type piezoelectric vibrating reed that includes a pair of vibration arm portions, a package that accommodates the piezoelectric vibrating reed, and a pair of regulation films that is formed along a longitudinal direction of the vibration arm portions corresponding to each of the pair of vibration arm portions, the piezoelectric vibrator being capable of improving the degree of vacuum in the package by irradiating the regulation films with a laser to evaporate a part of the regulation films, wherein an irradiation trace of the laser is formed in symmetrical positions via a center axis of the pair of vibration arm portions in the pair of regulation films.

With the piezoelectric vibrator and the method of manufacturing the same according to the present invention, by irradiating a laser in symmetrical positions via the center axis of the pair of vibration arm portions in the pair of regulation films to evaporate a part of the regulation films, the regulation films to be deposited on side surfaces of the pair of vibration arm portions can be made approximately uniform. Particularly, the vibration properties of the vibration arm portions are changed by the gettering position in the longitudinal direction of the vibration arm portions, but it is possible to match the vibration properties of the pair of vibration arm portions by performing the gettering in symmetrical positions via the center axis. Thus, even after the gettering process, the stable vibration property can be obtained and the vibration leakage can be reduced. As a consequence, the throughput can be improved.

Furthermore, an oscillator according to the invention is configured so that the piezoelectric vibrator is electrically connected to an integrated circuit as an oscillating element.

Furthermore, electronic equipment according to the invention is configured so that the piezoelectric vibrator is electrically connected to a measurement portion.

Furthermore, a radio-controlled timepiece according to the invention is configured so that the piezoelectric vibrator is electrically connected to a filter portion.

In the oscillator, the electronic equipment and the radio-controlled timepiece according to the invention, since they have a piezoelectric vibrator which reduces the vibration leakage and can improve the throughput, it is possible to provide an oscillator, electronic equipment, and a radio-controlled time piece with a stable vibration property.

ADVANTAGEOUS EFFECTS

With the method of producing the piezoelectric vibrator according to the invention, by irradiating a laser in symmetrical positions via the center axis of the pair of vibration arm portions in the pair of regulation films to evaporate a part of the regulation films, the regulation films to be deposited on side surfaces of the pair of vibration arm portions can be made approximately uniform. Particularly, the vibration properties of the vibration arm portions are changed by the gettering position in the longitudinal direction of the vibration arm portions, but it is possible to match the vibration properties of the pair of vibration arm portions by performing the gettering in symmetrical positions via the center axis. Thus, even after the gettering process, the stable vibration property can be obtained and the vibration leakage can be reduced. As a consequence, the throughput can be improved.

DETAILED DESCRIPTION OF THE PREFERRED EMBODIMENTS

Figure 1:
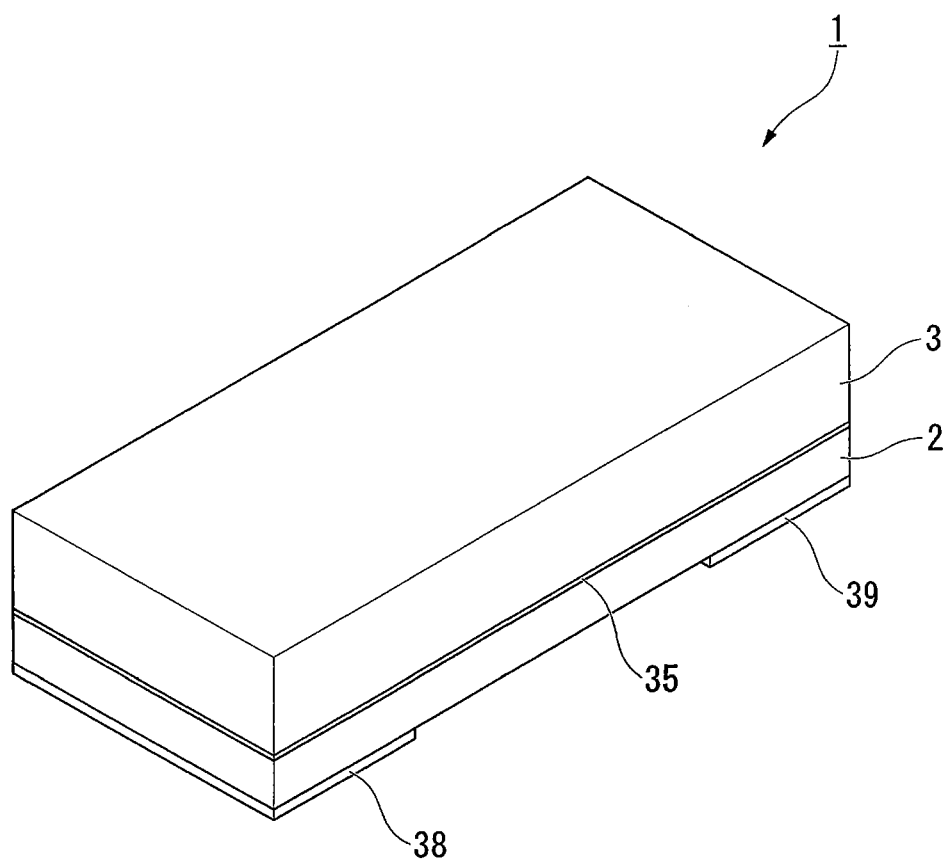
FIG. 1 is an exterior perspective view that shows an embodiment of a piezoelectric vibrator according to the invention.

Hereinafter, an embodiment of a piezoelectric vibrator according to the invention will be explained with reference to FIGS. 1 to 17.

As shown in FIGS. 1 to 4, a piezoelectric vibrator 1 is formed in the shape of a box, in which a base substrate 2 and a lid substrate 3 are stacked as two layers, and is an SMD type piezoelectric vibrator in which a piezoelectric vibrating reed 4 is accommodated within a cavity C of an inner portion thereof. Furthermore, in FIG. 4, in order to make the drawings easier to see, an excitation electrodes 15, lead-out electrodes 19 and 20, mount electrodes 16 and 17, and a weight metal film 21 described later are omitted.

Figure 5:
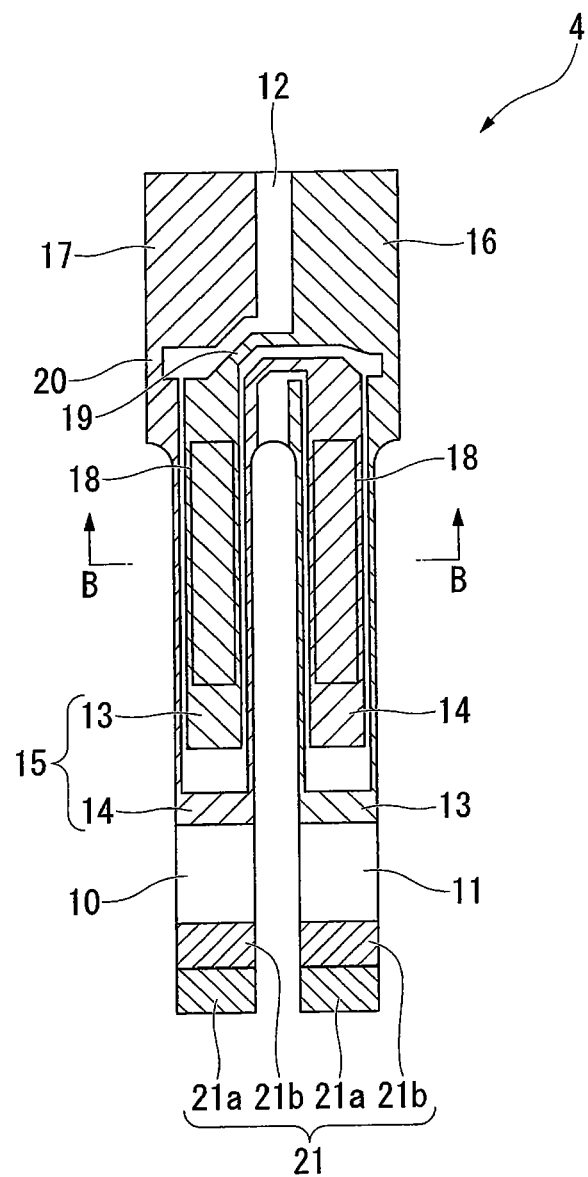
FIG. 5 is a plane view of a piezoelectric vibrating reed constituting the piezoelectric vibrator shown in FIG. 1.
Figure 6:
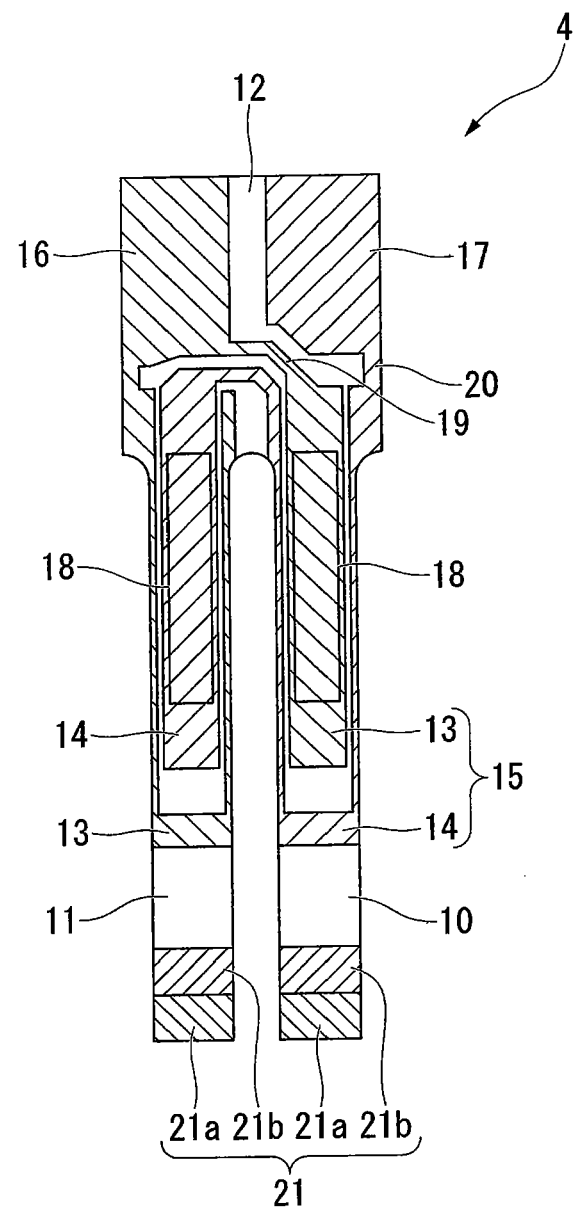
FIG. 6 is a view from below of the piezoelectric vibrating reed shown in FIG. 5.
Figure 7:
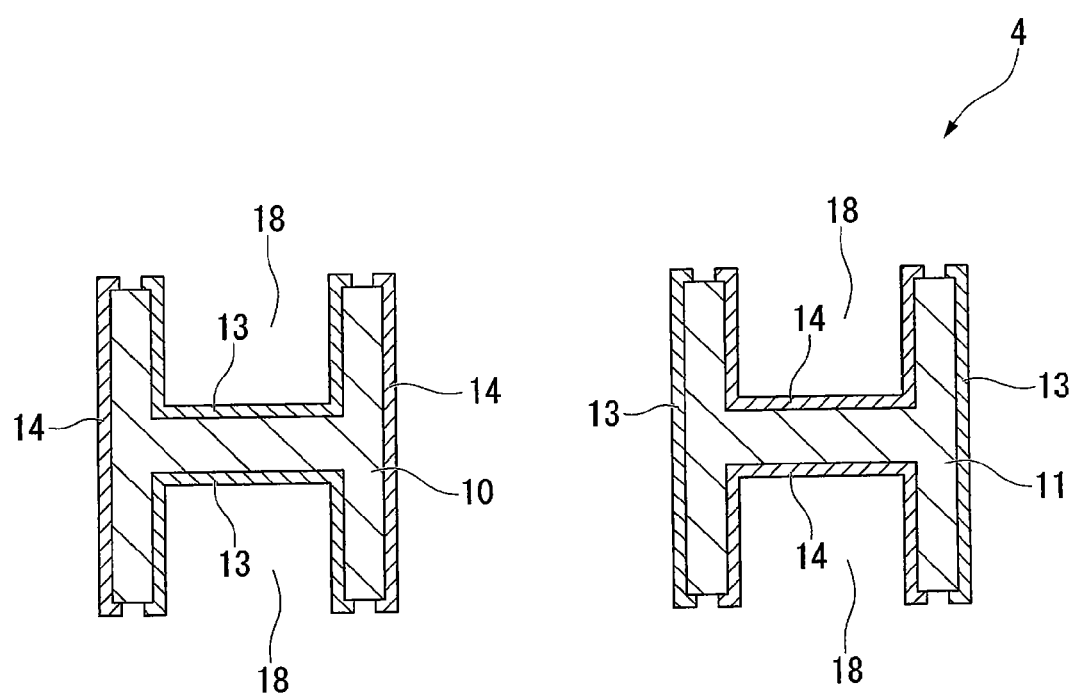
FIG. 7 is a cross-sectional view taken from arrows B-B shown in FIG. 5.

As shown in FIGS. 5 to 7, the piezoelectric vibrating reed 4 is a tuning fork type vibrating reed formed of piezoelectric materials such as crystal, lithium tantalate or lithium niobate, and is vibrated when a predetermined voltage is applied. The piezoelectric vibrating reed 4 has a pair of vibration arm portions 10 and 11 extending in parallel, a base portion 12 that integrally fixes proximal end sides of the pair of vibration arm portions 10 and 11, an excitation electrode 15 including a first excitation electrode 13 and a second excitation electrode 14 that is formed on outer surfaces of the pair of vibration arm portions 10 and 11 to vibrate the pair of vibration arm portions 10 and 11, and mount electrodes 16 and 17 that are electrically connected to the first excitation electrode 13 and the second excitation electrode 14. In addition, the piezoelectric vibrating reed 4 of the present embodiment includes groove portions 18 that are formed on both main surfaces of the pair of vibration arm portions 10 and 11 along a longitudinal direction of the vibration arm portions 10 and 11, respectively. The groove portions 18 are formed from the proximal end sides of the vibration arm portions 10 and 11 up to approximately near middle portions thereof.

The excitation electrode 15 including the first excitation electrode 13 and the second excitation electrode 14 are electrodes that vibrate the pair of vibration arm portions 10 and 11 in a direction approaching and retracting from each other by a predetermined resonant frequency, and are patterned and formed on the outer surfaces of the pair of vibration arm portions 10 and 11 in a state of being electrically separated, respectively. Specifically, as shown in FIG. 7, the first excitation electrode 13 is mainly formed on the groove portions 18 of one vibration arm portion 10 and on both side surfaces of the other vibration arm portion 11, and the second excitation electrode 14 is mainly formed on both side surfaces of one vibration arm portion 10 and on the groove portions 18 of the other vibration arm portion 11.

Furthermore, as shown in FIGS. 5 and 6, the first excitation electrode 13 and the second excitation electrode 14 are electrically connected to the mount electrodes 16 and 17 via lead-out electrodes 19 and 20 on both main surfaces of the base portion 12, respectively. Moreover, the voltage is applied to the piezoelectric vibrating reed 4 via the mount electrodes 16 and 17. In addition, the excitation electrode 15, the mount electrodes 16 and 17, and the lead-out electrodes 19 and 20 are formed, for example, by the coating of conductive films such as chromium (Cr), nickel (Ni), aluminum (Al) and titanium (Ti).

Furthermore, on the front ends of the pair of vibration arm portions 10 and 11, a weight metal film 21 for regulating (frequency regulation) its own vibration state so as to be vibrated within a range of a predetermined frequency is coated. In addition, the weight metal film 21 is divided into a rough regulation film 21a used when roughly regulating the frequency and a minute regulation film 21b used when minutely regulating the frequency. By performing the frequency regulation using the rough regulation film 21a and the minute regulation film 21b, it is possible to limit the frequencies of the pair of vibration arm portions 10 and 11 within the range of a nominal frequency of a device.

Figure 3:
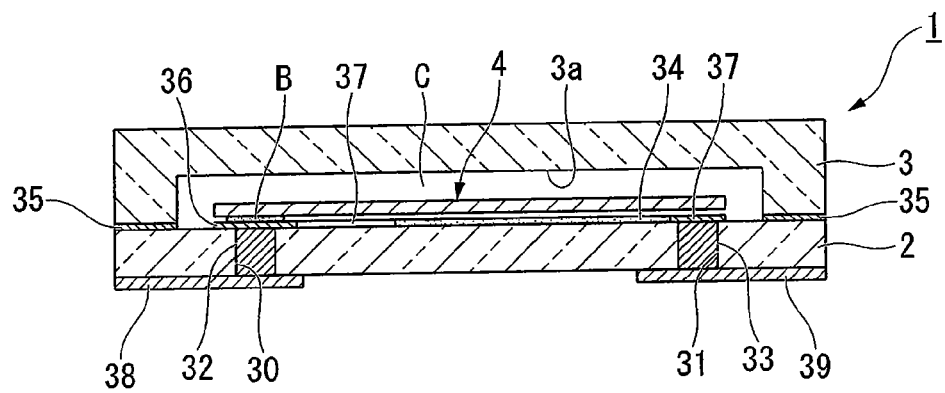
FIG. 3 is a cross-sectional view of the piezoelectric vibrator taken along line A-A shown in FIG. 2.
Figure 4:
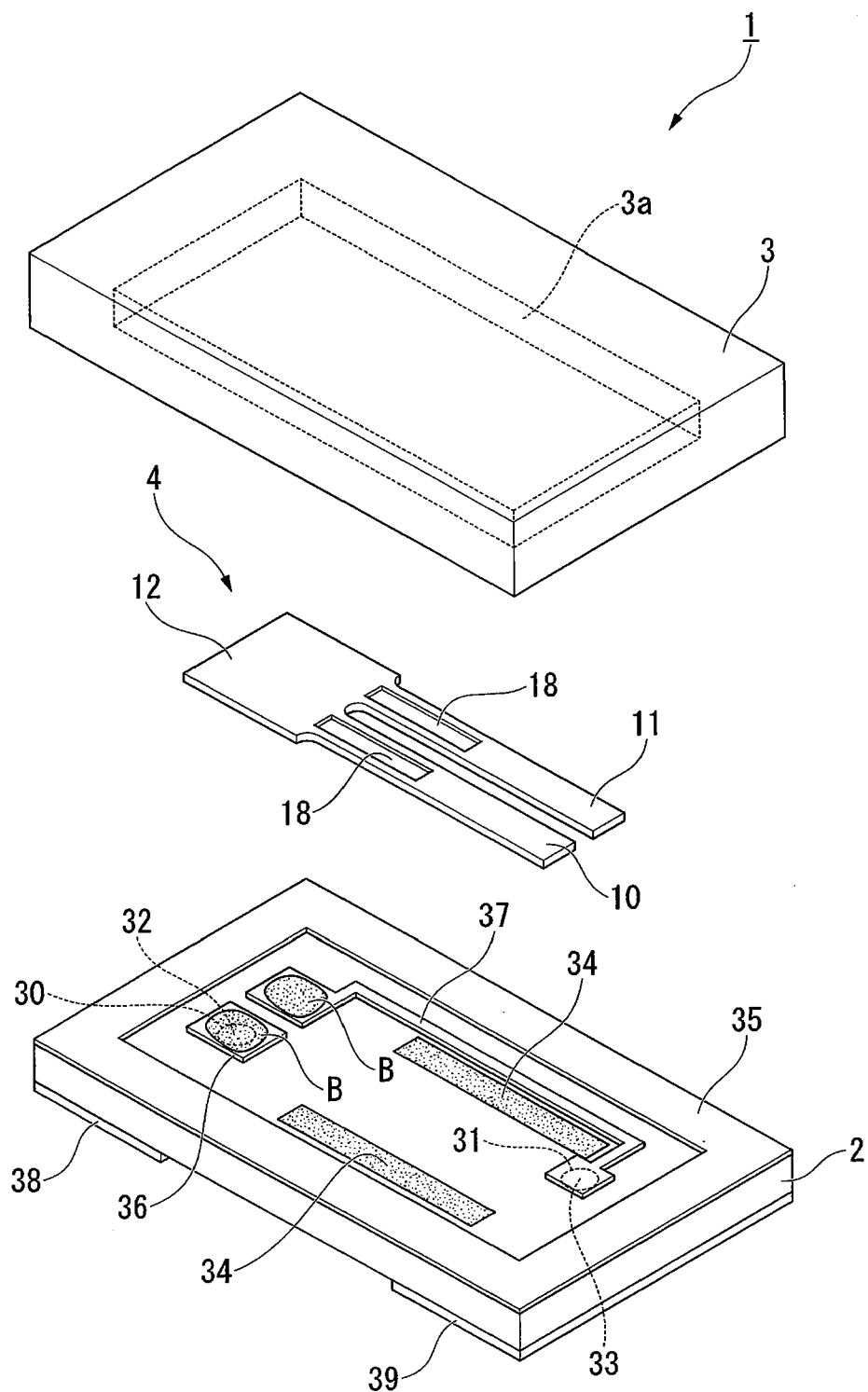
FIG. 4 is an exploded perspective view of the piezoelectric vibrator shown in FIG. 1.

As shown in FIGS. 3 and 4, the piezoelectric vibrating reed 4 configured as above is bump-bonded to the upper surface of the base substrate 2 using a bump B such as gold. More specifically, the pair of mount electrodes 16 and 17 is bump-bonded on two bumps B, which are formed on a lead-out electrodes 36 and 37 described later patterned on the upper surface of the base substrate 2, respectively, in the contact state. As a result, the piezoelectric vibrating reed 4 is supported in a state floating from the upper surface of the base substrate 2, and the mount electrodes 16 and 17 and the lead-out electrode 36 and 37 are electrically connected to each other, respectively. Furthermore, the bonding method of the piezoelectric vibrating reed 4 is not limited to bump-bonding. For example, the piezoelectric vibrating reed 4 may be bonded by a conductive adhesive. However, by the bump-bonding, the piezoelectric vibrating reed 4 can float from the upper surface of the base substrate 2, whereby a minimum vibration gap necessary for the vibration can naturally be secured. Thus, bump-bonding is desirable.

The lid substrate 3 is a transparent insulation substrate formed of a glass material, for example, soda lime glass, and, as shown in FIGS. 1, 3, and 4, is formed in the plate shape. Furthermore, on a bonding surface side to which the base substrate 2 is bonded, a rectangular concave portion 3a into which the piezoelectric vibrating reed 4 enters is formed. The concave portion 3a is a concave portion for the cavity becoming the cavity C which accommodates the piezoelectric vibrating reed 4 when both of the substrates 2 and 3 are overlapped with each other. Moreover, the lid substrate 3 is anode-bonded to the base substrate 2 in a state in which the concave portion 3a is opposed to the base substrate 2 side. In addition, the bonding method of the base substrate 2 and the lid substrate 3 is not limited to anode-bonding. However, anode-bonding is desirable in that, by performing the anode-bonding, both substrate 2 and 3 can strongly be bonded to each other.

The base substrate 2 is a transparent insulation substrate formed of the same glass material as the lid substrate 3, for example, soda lime glass, and, as shown in FIGS. 1 to 4, is formed in the shape of a plate and large enough to be able to overlap with the lid substrate 3. In the base substrate 2, a pair of through holes 30 and 31 penetrating the base substrate 2 is formed. At this time, the pair of through holes 30 and 31 is formed so as to enter the cavity C. To explain in more detail, the through holes 30 and 31 of the present embodiment are formed so that one through hole 30 is situated at the base portion 12 side of the mounted piezoelectric vibrating reed 4 and the other through hole 31 is situated at the front end sides of the vibration arm portions 10 and 11. Moreover, in the pair of through holes 30 and 31, a pair of through electrodes 32 and 33, which are formed so as to bury the through holes 30 and 31, are formed. As shown in FIG. 3, the through electrodes 32 and 33 play a role in completely blocking the through holes 30 and 31 to maintain the airtightness in the cavity C and electrically connecting external electrodes 38 and 39 described later with the lead-out electrodes 36 and 37.

On the upper surface side (a bonding surface side to which the lid substrate 3 is bonded) of the base substrate 2, as shown in FIGS. 1 to 4, a getter material (a regulation film) 34 that improves the degree of vacuum in the cavity C by being irradiated with a laser, a bonding film 35 for the anode-bonding, and a pair of lead-out electrodes 36 and 37 are patterned. In addition, the bonding film 35 and the pair of lead-out electrodes 36 and 37 are formed of a conductive material (for example, aluminum).

Figure 2:
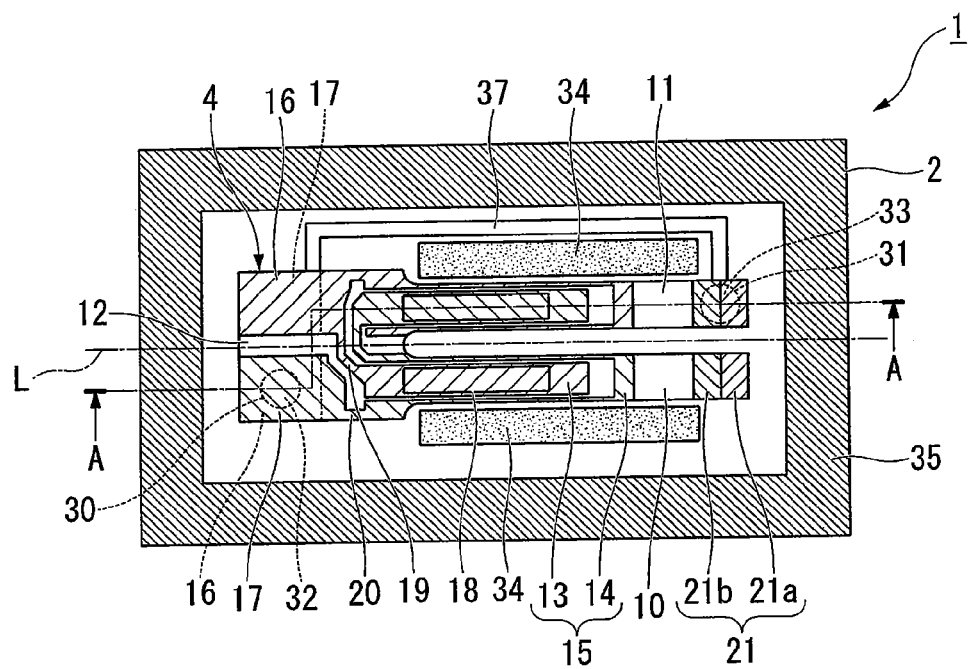
FIG. 2 is an inner configuration diagram of the piezoelectric vibrator shown in FIG. 1 which shows a piezoelectric vibrating reed from above with a lid substrate removed therefrom.

The getter material 34 is formed of aluminum or the like so as to extend from the proximal end side to the front end side along the longitudinal direction of the vibration arm portions 10 and 11 in the state of adjoining near the pair of vibration arm portions 10 and 11 when seen from the plane. Specifically, as shown in FIGS. 2 and 4, the getter material 34 is formed at the outer surface sides of the pair of vibration arm portions 10 and 11 and in symmetrical positions via the center axis L of the pair of vibration arm portions 10 and 11.

Furthermore, the bonding film 35 is formed along the periphery of the base substrate 2 so as to surround the periphery of the concave portion 3a formed in the lid substrate 3.

Furthermore, the pair of lead-out electrodes 36 and 37 is patterned so as to electrically connect the one through electrode 32 of the pair of through electrodes 32 and 33 with one mount electrode 16 of the piezoelectric vibrating reed 4, and so as to electrically connect the other through electrode 33 with the other mount electrode 17 of the piezoelectric vibrating reed 4. To explain in more detail, one lead-out electrode 36 is formed immediately over one through electrode 32 so as to be situated immediately under the base portion 12 of the piezoelectric vibrating reed 4. In addition, the other lead-out electrode 37 is formed so as to be led out from a position adjacent to one lead-out electrode 36 to the front end side along the vibration arm portions 10 and 11, and then be situated immediately over the other through electrode 33.

Moreover, the bumps B are formed on the pair of lead-out electrodes 36 and 37, respectively, and the piezoelectric vibrating reed 4 is mounted using the bump B. As a result, one mount electrode 16 of the piezoelectric vibrating reed 4 is electrically connected to one through electrode 32 via one lead-out electrode 36, and the other mount electrode 17 is electrically connected to the other through electrode 33 via the other lead-out electrode 37.

Moreover, as shown in FIGS. 1, 3 and 4, on the lower surface of the base substrate 2, external electrodes 38 and 39, which are electrically connected to the pair of through electrodes 32 and 33, respectively, are formed. That is, one external electrode 38 is electrically connected to the first excitation electrode 13 of the piezoelectric vibrating reed 4 via one through electrode 32 and one lead-out electrode 36. Furthermore, the other external electrode 39 is electrically connected to the second excitation electrode 14 of the piezoelectric vibrating reed 4 via the other through electrode 33 and the other lead-out electrode 37.

In the case of operating the piezoelectric vibrator 1 configured as above, a predetermined driving voltage is applied to the external electrodes 38 and 39 formed on the base substrate 2. As a result, it is possible to make the electric current flow to the excitation electrode 15 including the first excitation electrode 13 and the second excitation electrode 14 of the piezoelectric vibrating reed 4, which makes it possible to vibrate the pair of vibration arm portions 10 and 11 in the approaching and separating direction by a predetermined frequency. Moreover, it is possible to use the vibration of the pair of vibration arm portions 10 and 11 as a time source, a timing source of the control signal, a reference signal source or the like.

(Method of Manufacturing Piezoelectric Vibrator)

Next, a method of manufacturing a plurality of abovementioned piezoelectric vibrators 1 using a base substrate wafer (a base substrate) 40 and a lid substrate wafer (a lid substrate) 50 at a time will be explained with reference to the flow chart shown in FIG. 8. In addition, in the present embodiment, a plurality of piezoelectric vibrators 1 is manufactured using the wafer-shaped substrate at a time, but one, in which the size is matched with the exterior of the base substrate 2 and the lid substrate 3 in advance, may be worked to manufacture one at a time, without being limited thereto.

Firstly, a piezoelectric vibrating reed production process is performed to produce the piezoelectric vibrating reed 4 shown in FIGS. 5 to 7 (S10). Specifically, firstly, a crystal Lambert gemstone is sliced at a predetermined angle to make a wafer of a fixed thickness. Next, after the wafer is wrapped and is subjected to rough working, a deformed layer is removed by etching, and then a mirror surface polishing such as a polish is performed, thereby making a wafer of a predetermined thickness. Next, after the wafer is subjected to suitable processing such as cleaning, the wafer is patterned by a photolithograph technique or the like to the exterior shapes of the piezoelectric vibrating reed 4, and the film formation and the patterning of the metallic film are performed, thereby forming the excitation electrode 15, the lead-out electrodes 19 and 20, the mount electrodes 16 and 17 and the weight metal film 21. As a result, a plurality of piezoelectric vibrating reeds 4 can be produced.

Furthermore, after producing the piezoelectric vibrating reed 4, the rough regulation of the resonance frequency is performed. This is performed by irradiating the rough regulation film 21a of the weight metal film 21 with laser beam to evaporate a part thereof and changing the weight thereof. In addition, a minute regulation, in which the resonance frequency is further accurately regulated is performed after the mounting. This will be described later.

Figure 9:
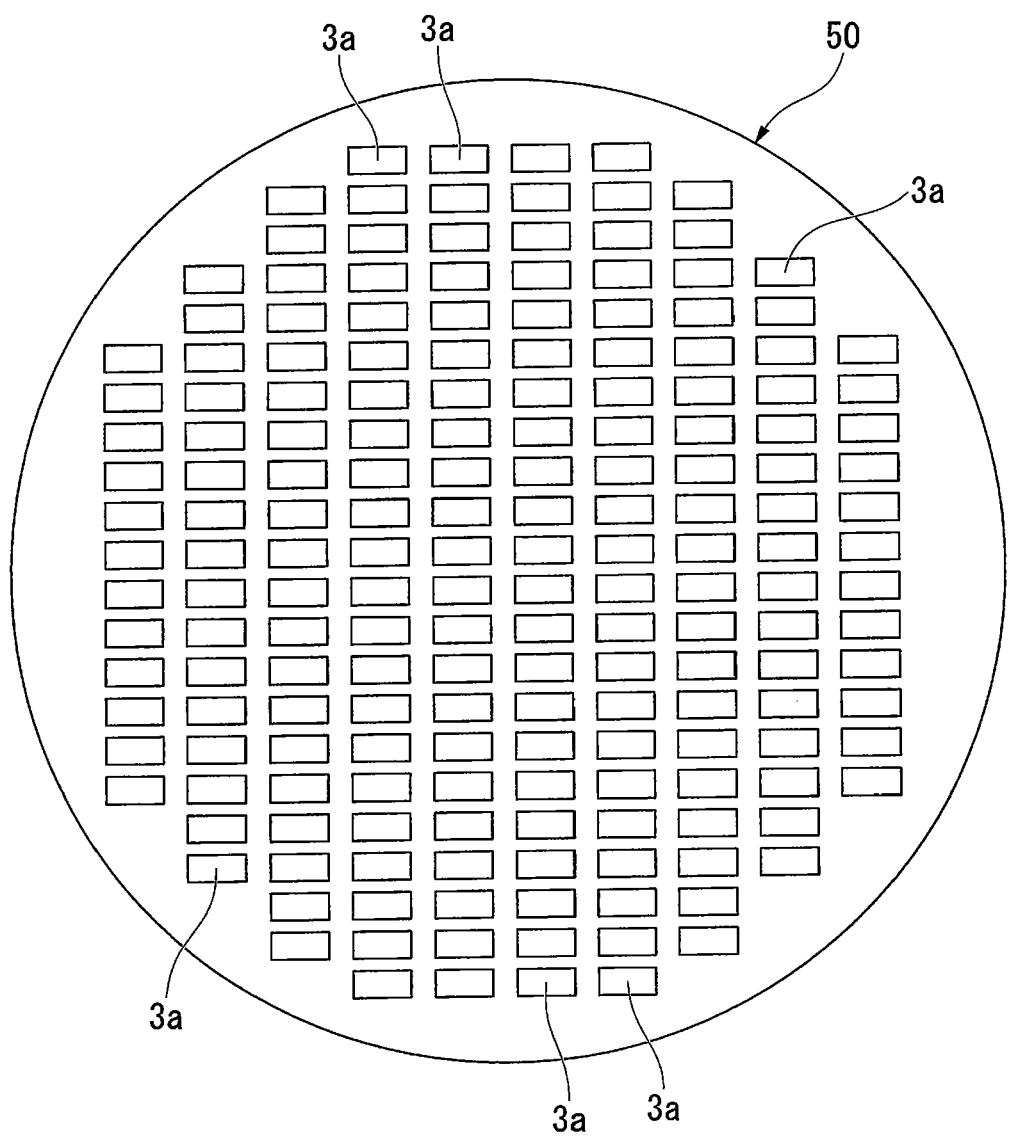
FIG. 9 is a diagram showing a process when manufacturing the piezoelectric vibrator according to a flow chart shown in FIG. 8 which shows a state in which a plurality of concave portions and a bonding film are formed in a lid substrate wafer becoming a source of the lid substrate.

Next, a first wafer producing process, in which the lid substrate wafer 50 becoming the lid substrate 3 later is produced up to a state immediately before performing an anode-bonding, is performed (S20). Firstly, after the soda lime glass is polished up to a predetermined thickness and is cleaned, a circular plate shaped lid substrate wafer 50, in which the deformed layer of the uppermost surface is removed by etching or the like, is formed (S21). Next, as shown in FIG. 9, a concave portion forming process, in which a plurality of concave portions 3a for the cavity is formed by etching or the like on the bonding surface of the lid substrate wafer 50 in a column and row direction, is performed (S22). At this point in time, the first wafer producing process is finished.

Next, at the timing simultaneously with or immediately before and after the process, a second wafer producing process, in which the base substrate wafer 40 becoming the base substrate 2 later is produced until the state immediately before performing an anode-bonding, is performed (S30). Firstly, after the soda lime glass is polished up to a predetermined thickness and is cleaned, a circular plate-shaped base substrate wafer 40, in which a deformed layer of the uppermost surface is removed by etching or the like, is formed (S31).

Next, a through electrode forming process, in which a plurality of pairs of through electrodes 32 and 33 is formed on the base substrate wafer 40, is performed (S32). Specifically, firstly, a plurality of pair of through holes 30 and 31 is formed by sand blasting or press working. Moreover, the pair of through electrodes 32 and 33 is formed in the plurality of pair of through holes 30 and 31. By the pair of through electrodes 32 and 33, the pair of through holes 30 and 31 is sealed and the electric conductivity between the upper surface side and the lower surface side of the base substrate wafer 40 is secured.

Next, a regulation film forming process, in which aluminum or the like is patterned on the upper surface of the base substrate wafer 40 to form the getter material 34 in the base substrate wafer 40, is performed (S33). At this time, the getter material 34 extends from the proximal end side to the front end side along the longitudinal direction of the vibration arm portions 10 and 11 in the state of adjoining near the pair of vibration arm portions 10 and 11 when seen from the plane, and is formed in the outer surface sides of the pair of vibration arm portions 10 and 11 and in positions symmetric via the center axis L (see FIG. 2) of the pair of vibration arm portions 10 and 11.

Figure 10:
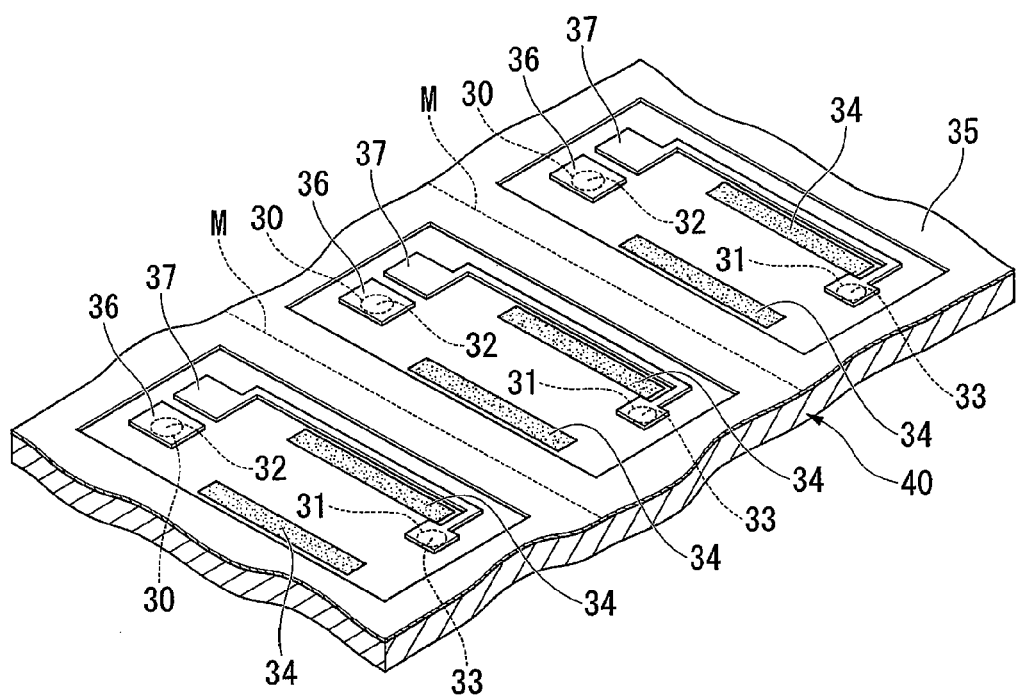
FIG. 10 is a diagram showing a process of manufacturing the piezoelectric vibrator according to a flow chart shown in FIG. 8 which shows a state in which a getter material, a through electrode, a lead-out electrode, and a bonding film are formed in a base substrate wafer becoming a source of the base substrate.
Figure 11:
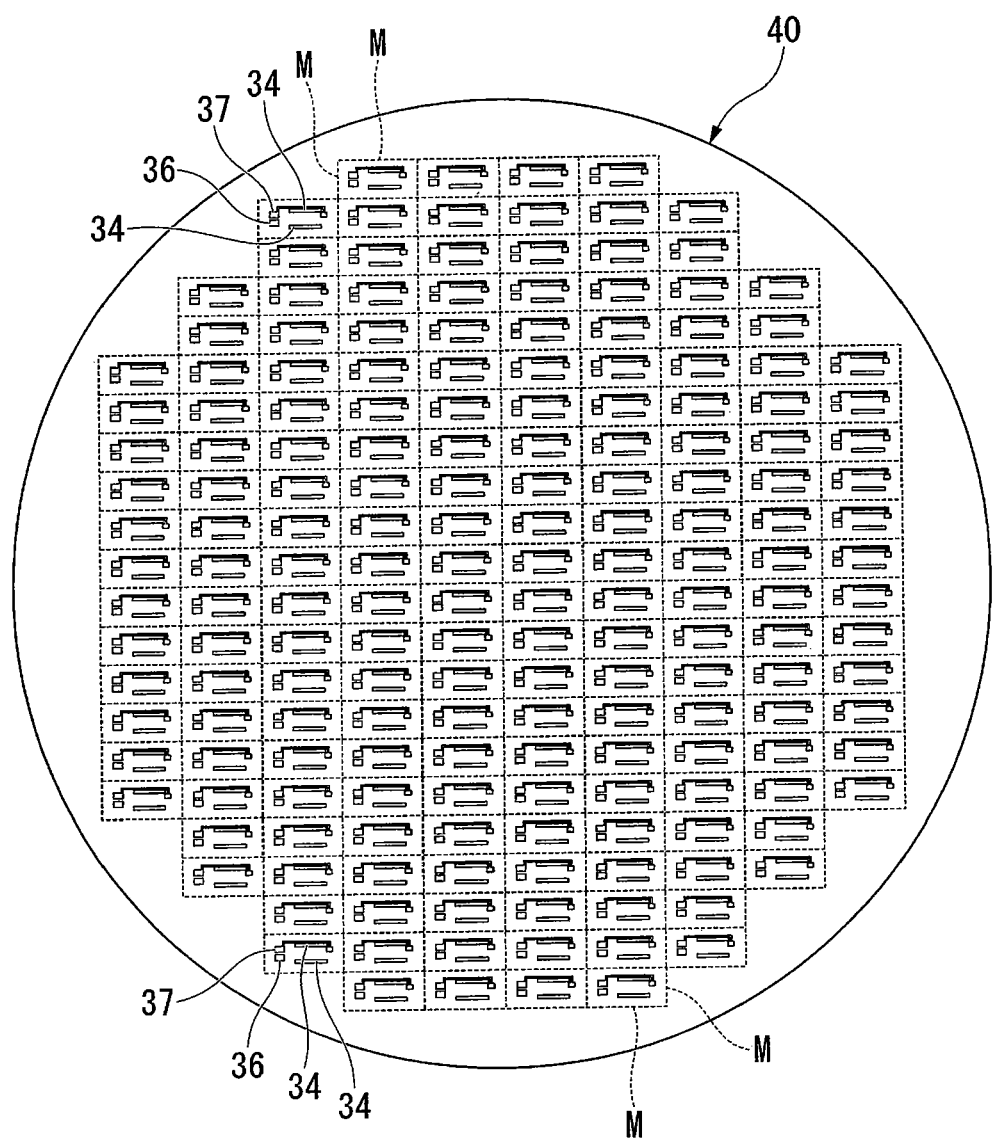
FIG. 11 is an overall diagram of the base substrate wafer of the state shown in FIG. 10.

Moreover, as shown in FIGS. 10 and 11, a bonding film forming process, in which the conductive material is patterned on the upper surface of the base substrate wafer 40 to form the bonding film 35, is performed (S34), and a lead-out electrode forming process, in which a plurality of lead-out electrodes 36 and 37 electrically connected to each of the pair of through electrodes 32 and 33, respectively is formed, is performed (S35). In addition, the dash lines M shown in FIGS. 10 and 11 show the cutting lines which are cut in a cutting process performed later. By performing the processes, the second wafer producing process is finished.

Figure 8:
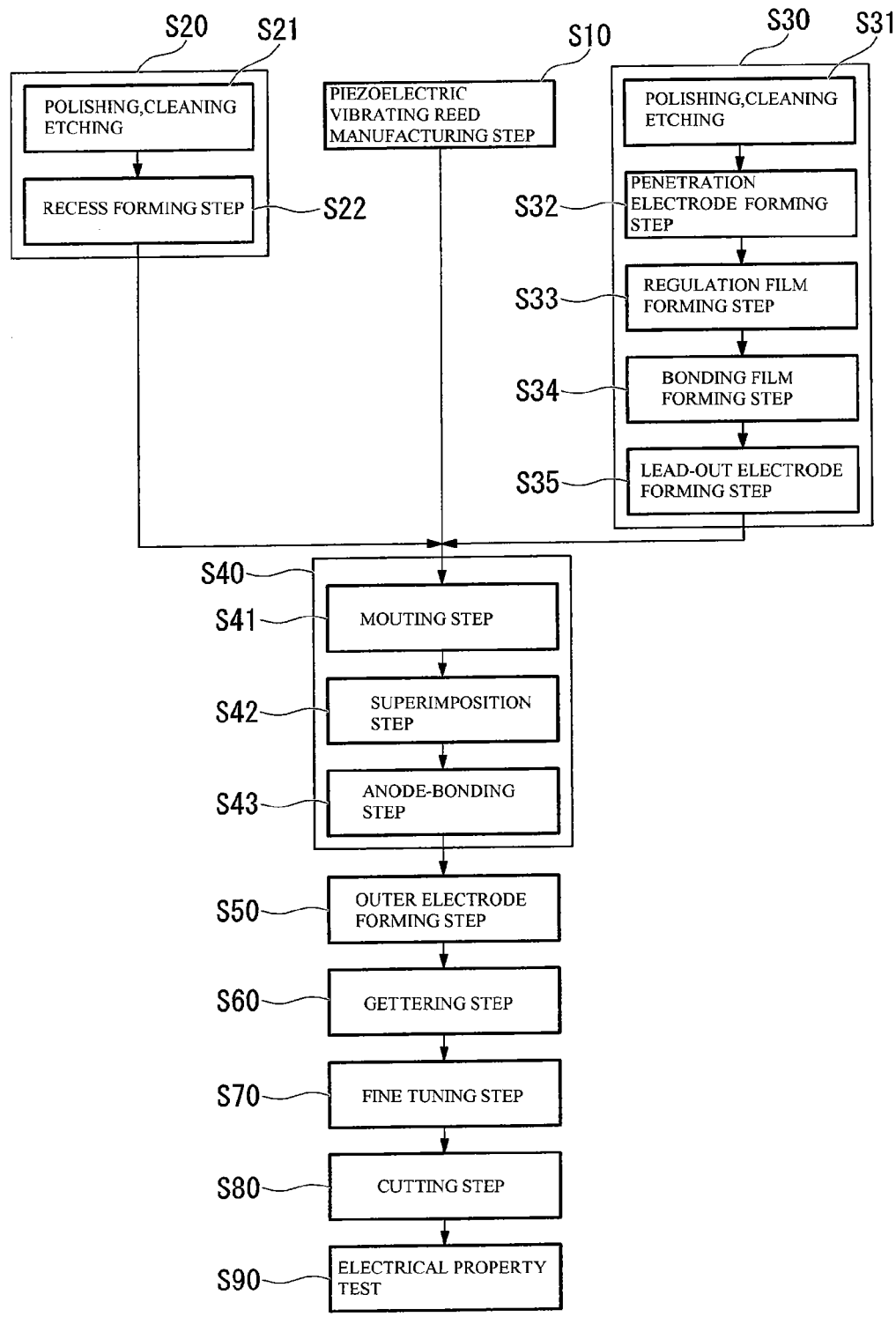
FIG. 8 is a flow chart that shows the flow when manufacturing the piezoelectric vibrator shown in FIG. 1.

In addition, in FIG. 8, the regulation film forming process (S33), the bonding film forming process (S34), the lead-out electrode forming process (S35) are sequentially performed, but the order is not limited thereto or the overall process may concurrently be performed. Even in any process order, the same working effect can be obtained. Thus, the process order may be suitably selected and changed as occasion demands.

Next, a bonding process, in which the base substrate wafer 40 and the lid substrate wafer 50 are bonded to each other, is performed (S40). To explain the bonding process in detail, firstly, a mount process, in which the plurality of produced piezoelectric vibrating reeds 4 is bonded to the upper surface of the base substrate wafer 40 via the lead-out electrodes 36 and 37, respectively, is performed (S41). Firstly, the bump B such as gold is formed on the pair of lead-out electrodes 36 and 37, respectively. Moreover, after the base portion 12 of the piezoelectric vibrating reed 4 is mounted on the bump B, the piezoelectric vibrating reed 4 is pressed to the bump B while heating the bump B at a predetermined temperature. As a result, the piezoelectric vibrating reed 4 is mechanically supported on the bump B, and the mount electrodes 16 and 17 and the lead-out electrodes 36 and 37 are electrically connected to each other. Thus, at this point in time, the pair of excitation electrodes 15 of the piezoelectric vibrating reed 4 is electrically connected to the pair of through electrodes 32 and 33, respectively. In addition, since the piezoelectric vibrating reed 4 is bump-bonded, it is supported in the state of floating from the upper surface of base substrate wafer 40.

After the mount of the piezoelectric vibrating reed 4 is finished, an overlapping process, in which the lid substrate wafer 50 is overlapped with the base substrate wafer 40, is performed (S42). Specifically, both wafers 40 and 50 are aligned in the correct position while setting a standard mark (not shown) as an index. As a result, the mounted piezoelectric vibrating reed 4, is accommodated within the cavity C which is surrounded by the concave portion 3a formed on the base substrate wafer 40 and both wafers 40 and 50.

Figure 12:
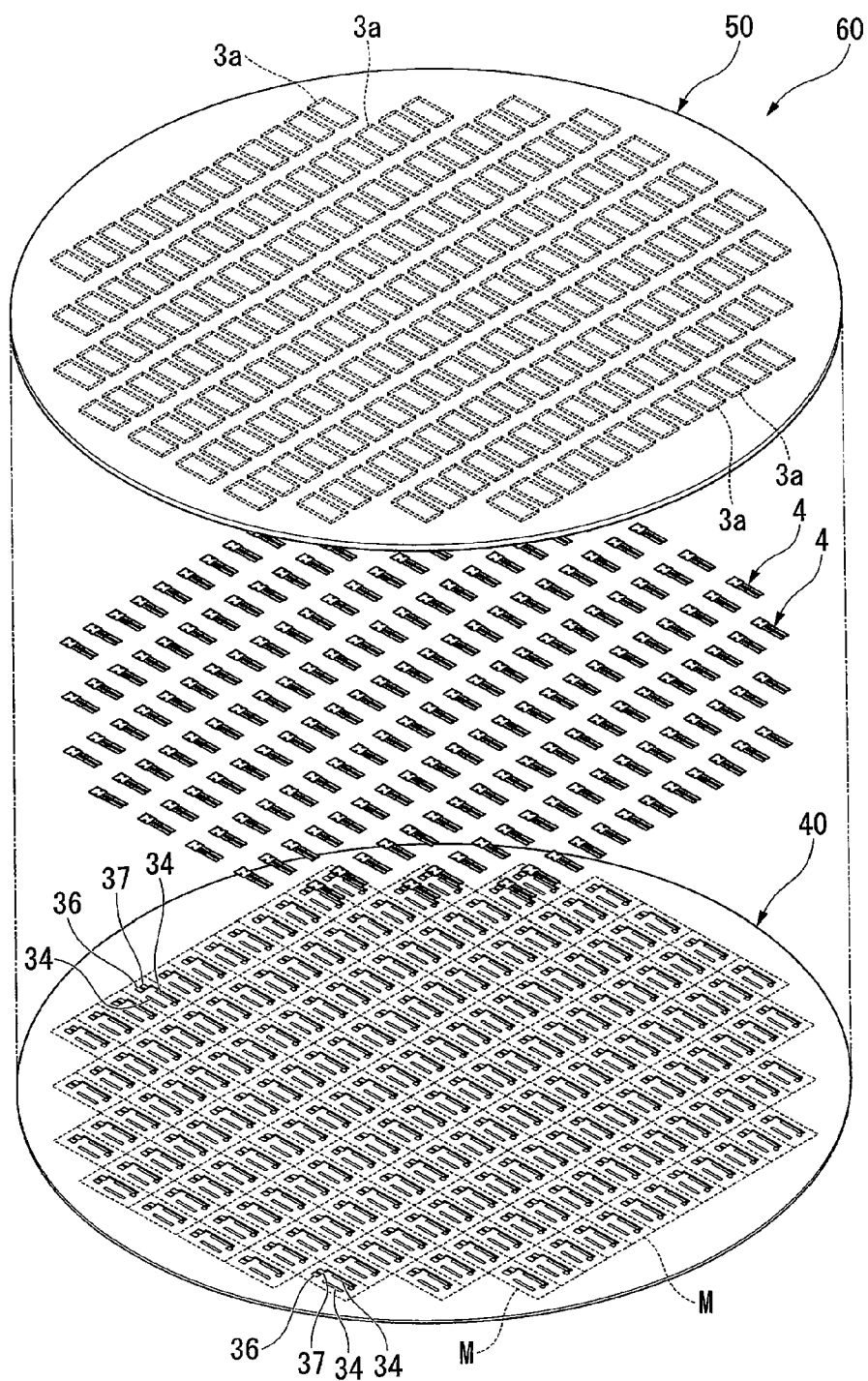
FIG. 12 is a diagram showing a process of manufacturing the piezoelectric vibrator according to a flow chart shown in FIG. 8 which shows an exploded perspective view of a wafer body in which the base substrate wafer and the lid substrate wafer are subjected to an anode-bonding in a state in which the piezoelectric vibrating reed is accommodated in the cavity.

After the overlapping process, two overlapped wafers 40 and 50 are put in an anode-bonding device (not shown) and a predetermined voltage is applied at a predetermined temperature environment to perform the anode-bonding (S43). Specifically, a predetermined voltage is applied between the bonding film 35 and the lid substrate wafer 50. Then, an electrochemical reaction occurs in an interface between the bonding film 35 and the lid substrate wafer 50, and both of them are strongly bonded to each other and are subjected to the anode-bonding. As a result, the piezoelectric vibrating reed 4 can be sealed within the cavity C, and it is possible to obtain a wafer body 60 shown in FIG. 12 in which the base substrate wafer 40 and the lid substrate wafer 50 are bonded to each other. In addition, in FIG. 12, in order to make the drawing easier to see, the wafer body 60 is shown in an exploded state, and the bonding film 35 from the base substrate wafer 40 is not shown in the drawing. In addition, the dash lines M shown in FIG. 12 show the cutting lines which are cut in a cutting process performed later. By performing the anode-bonding, the bonding process is finished.

Moreover, after the above-mentioned anode-bonding process is finished, an external electrode forming process, in which an conductive material is patterned on the lower surface of the base substrate wafer 40, and a plurality of pairs of external electrodes 38 and 39 electrically connected to the pair of through electrodes 32 and 33, respectively is formed, is performed (S50). By this process, it is possible to operate the piezoelectric vibrating reed 4 sealed in the cavity C using the external electrodes 38 and 39.

Next, a gettering process, in which the getter material 34 is irradiated with a laser and is evaporated while vibrating the piezoelectric vibrating reed 4 sealed in the cavity C to measure the series resonance resistance value, thereby regulating the degree of vacuum in the cavity C over a fixed level, is performed (S60). Herein, the fixed level refers to a state in which the series resonance resistance value is not greatly changed even when the degree of vacuum is improved more than that level. As a result, the suitable series resonance resistance value can be secured.

To explain specifically, the voltage is applied to the pair of external electrodes 38 and 39 formed on the lower surface of the base substrate wafer 40 to vibrate the piezoelectric vibrating reed 4. Furthermore, a laser is irradiated through the base substrate wafer 40 (from the surface side on which the external electrodes 38 and 39 are not formed) while measuring the series resonance resistance value, thereby heating and evaporating the getter material 34. As a result, the suitable series resonance resistance can be secured. In addition, when irradiating the getter material 34 with a laser, in the state of fixing a laser beam source device, the base substrate wafer 40 is moved to irradiate a desired position of the getter material 34 with a laser.

Furthermore, in the gettering process, the degree of vacuum in the cavity C is regulated, and at the same time, the frequency is regulated in an approximation range near an object value while measuring the frequency using the getter material 34. Explaining the regulation method of the frequency at the time of the gettering process, firstly, the getter material 34 is formed in the outer surface sides of the pair of vibration arm portions 10 and 11 when seen from the plane and in positions symmetric via the center axis L (see FIG. 2) of the pair of vibration arm portions 10 and 11. Thus, when the getter material 34 is heated and evaporated, it is locally deposited on the side surfaces of the vibration arm portions 10 and 11 situated near the heating position. At this time, if the position, where the getter material 34 is deposited, is the proximal end sides of the vibration arm portions 10 and 11, the frequency tends to increase, and if the position is the front end sides thereof, the frequency tends to decrease. Thus, by changing the heating position of the getter material 34, the frequency can increase or decrease. Therefore, the heating position of the getter material 34 is decided depending on the difference between the approximation range and the actually measured frequency and the evaporated getter material 34 is locally deposited to the side surfaces of the vibration arm portions 10 and 11, whereby the vibration property of the vibration arm portions 10 and 11 can be changed. That is, at the time of the gettering, it is possible to regulate the frequency of the pair of vibration arm portions 10 and 11 in the approximation range near the object value.

Figure 13:
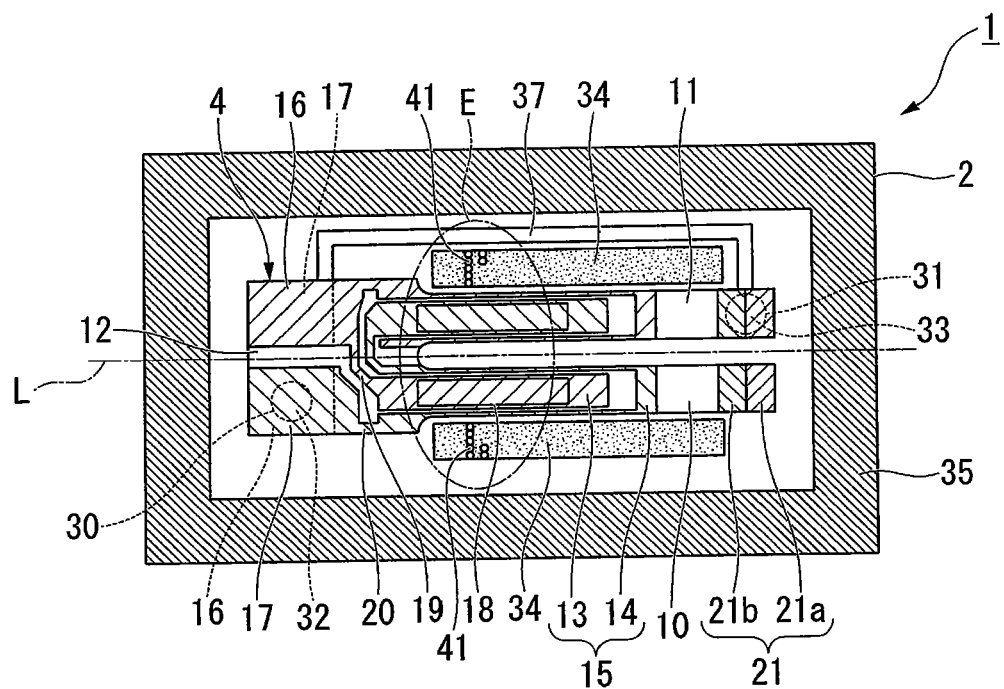
FIG. 13 is a diagram that shows a process when manufacturing the piezoelectric vibrator along the flow chart shown in FIG. 8 and shows a state of heating and evaporating a getter material of a proximal end side of a vibration arm portion.

For example, in a case where the frequency is lower than the approximation range, as shown in FIG. 13, the getter material 34 of the proximal end side (e.g., a range shown by the dash-dotted line in FIG. 13) of the pair of vibration arm portions 10 and 11 may be heated. As a result, the frequency is raised, whereby the frequency can be made closer to the approximation range. In this manner, by performing the gettering process, the suitable series resonance resistance value can be secured, and the frequency can be put in the approximation range in advance. In addition, the degree of vacuum in the cavity C does not depend on the heating position of the getter material 34.

Figure 14:
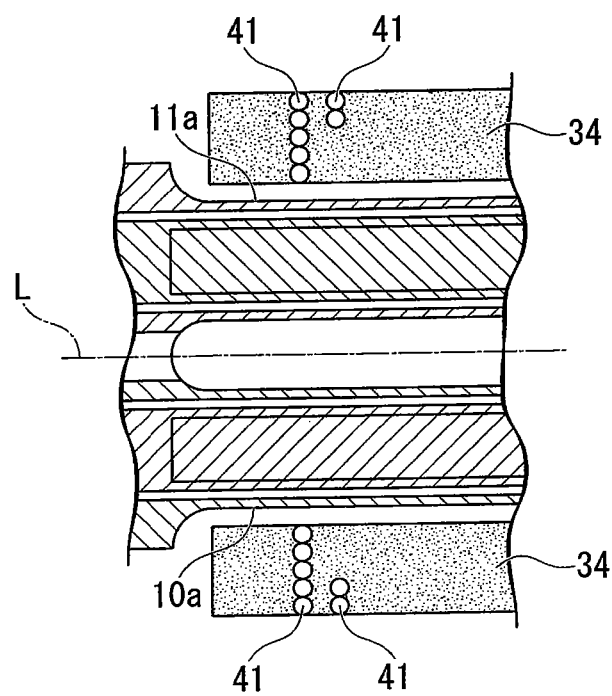
FIG. 14 is an enlarged view of a portion E of FIG. 13.

Moreover, in the present embodiment, when irradiating the getter material 34 with laser beam, in the pair of getter materials 34 and 34 formed so as to correspond to each of the pair of vibration arm portions 10 and 11, respectively, the positions symmetric via the center axis L of the pair of vibration arm portions 10 and 11 are irradiated with laser beam. Specifically, when the getter material 34 is irradiated with laser beam, as shown in FIG. 14, the laser irradiation trace 41 remains in the getter material 34, the getter material 34 of that portion is evaporated and is deposited on the side surfaces 10a and 11a of the outside of the pair of vibration arm portions 10 and 11. As in the present embodiment, by irradiating the positions symmetric via the center axis L with laser beam, the position and the amount of the getter material 34 deposited on the side surfaces 10a and 11a can substantially be equalized. Thus, the piezoelectric vibrator 1 formed in this manner obtains the stable vibration property and can reduce the vibration leakage.

Next, a minute regulation process, in which the minute regulation film 21b of the weight metal film 21 is heated by a laser or the like while continuously measuring the frequency and the frequency in the approximation range is minutely regulated and is made closer to the object value, is performed (S70). As a result, the frequency of the piezoelectric vibrating reed 4 can be regulated to enter a predetermined range of the nominal frequency.

After the minute regulation of the frequency is finished, a cutting process, in which the bonded wafer body 60 is cut along the cutting lines M shown in FIG. 12 to form small pieces, is performed (S80). As a result, it is possible to manufacture a plurality of two layer structure type of SMD type piezoelectric vibrators 1 shown in FIG. 1 in which the piezoelectric vibrating reed 4 is sealed in the cavity C formed between the base substrate 2 and the lid substrate 3 that are anode-bonded to each other at a time.

In addition, after the cutting process (S80) is performed to form the small pieces to the respective piezoelectric vibrators 1, the gettering process (S60) and the minute regulation process (S70) may be sequentially performed. However, as described above, by performing the gettering process (S60) and the minute regulation process (S70) in advance, the minute regulation can be performed in the state of the wafer body 60, which makes it possible to more effectively and minutely regulate the plurality of piezoelectric vibrators 1. Accordingly, it is desirable in that an improvement in throughput can be promoted.

After that, an internal electrical property inspection is performed (S90). That is, the resonant frequency, the resonant resistance value, the drive level property (an excitation electric power dependence of the resonant frequency and the resonant resistance value) or the like of the piezoelectric vibrating reed 4 are measured and checked. Furthermore, the insulation resistance property or the like is jointly checked. Lastly, the exterior inspection of the piezoelectric vibrator 1 is performed, and the size, the quality or the like are checked. As a result, the manufacturing of the piezoelectric vibrator 1 is finished.

According to the present embodiment, in the gettering process, by irradiating laser beam in symmetrical positions via the center axis L of the pair of getter materials 34 and 34 to evaporate a part of the getter material 34, the getter material 34 to be deposited on side surfaces 10a and 11a of the pair of vibration arm portions 10 and 11 can be made approximately uniform. Particularly, the vibration properties of the vibration arm portions 10 and 11 are changed by the gettering position in the longitudinal direction of the vibration arm portions 10 and 11, but it is possible to mate the vibration properties of the pair of vibration arm portions 10 and 11 by performing the gettering in symmetrical positions via the center axis L. Thus, even after the gettering process, the stable vibration property can be obtained and the vibration leakage can be reduced. As a consequence, the throughput can be improved.

(Oscillator)

Next, an embodiment of the oscillator according to the invention will be explained with reference to FIG. 15.

Figure 15:
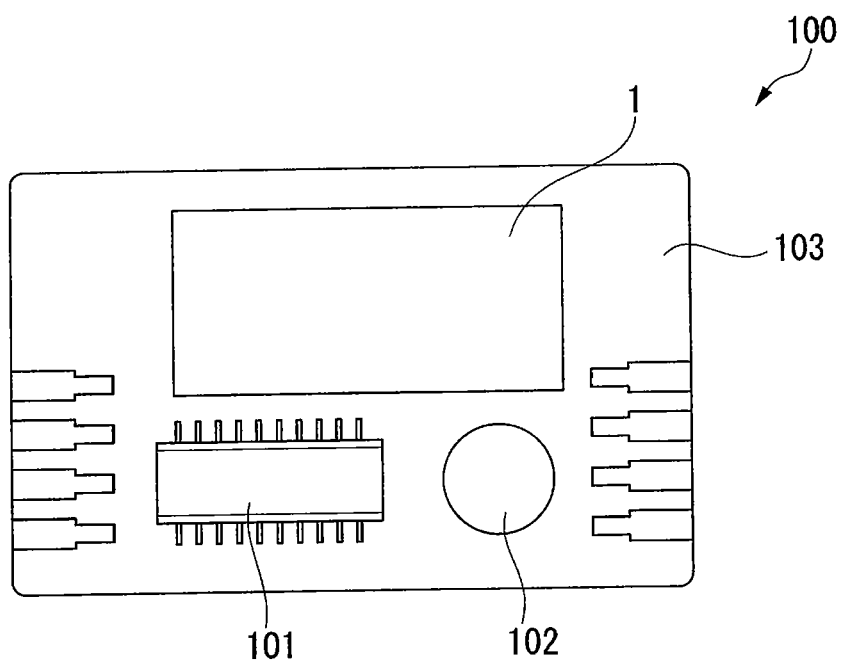
FIG. 15 is a configuration diagram showing an embodiment of an oscillator according to the invention.

As shown in FIG. 15, an oscillator 100 of the present embodiment is constituted as an oscillating element in which the piezoelectric vibrator 1 is electrically connected to an integrated circuit 101. The oscillator 100 includes a substrate 103 on which an electronic component 102 such as a condenser is mounted. The integrated circuit 101 for the oscillator is mounted on the substrate 103, the piezoelectric vibrator 1 is mounted in the vicinity of the integrated circuit 101. The electronic component 102, the integrated circuit 101 and the piezoelectric vibrator 1 are electrically connected to each other by a wiring pattern (not shown), respectively. In addition, the respective constituents are molded by resin (not shown).

In the oscillator 100 configured as above, when the voltage is applied to the piezoelectric vibrator 1, the piezoelectric vibrating reed 4 in the piezoelectric vibrator 1 is vibrated. The vibration is converted to the electric signal by the piezoelectric property of the piezoelectric vibrating reed 4 and input in the integrated circuit 101 as the electric signal. The input electric signal is subjected to the respective processing by the integrated circuit 101 and is output as the frequency signal. As a result, the piezoelectric vibrator 1 functions as the oscillating element.

Furthermore, in the configuration of the integrated circuit 101, by selectively setting an RTC (Real Time Clock) module or the like, for example, depending on the demand, the function of controlling the operating date or time of the equipment or external equipment, in addition to the timepiece single function oscillator or the like, or providing the time or the calendar or the like can be added.

As mentioned above, according to the oscillator 100 of the present embodiment, since it includes the piezoelectric vibrator 1 whose quality is improved by the minute regulation of the frequency with a high accuracy while reducing the accumulation of stress by heat, and which has a stable vibration characteristic due to the efficient gettering and minute regulation, the oscillator 100 itself can also promote high quality. Additionally, it is possible to obtain the high precision frequency signal that is stable over a long period of time.

(Electronic Equipment)

Figure 16:
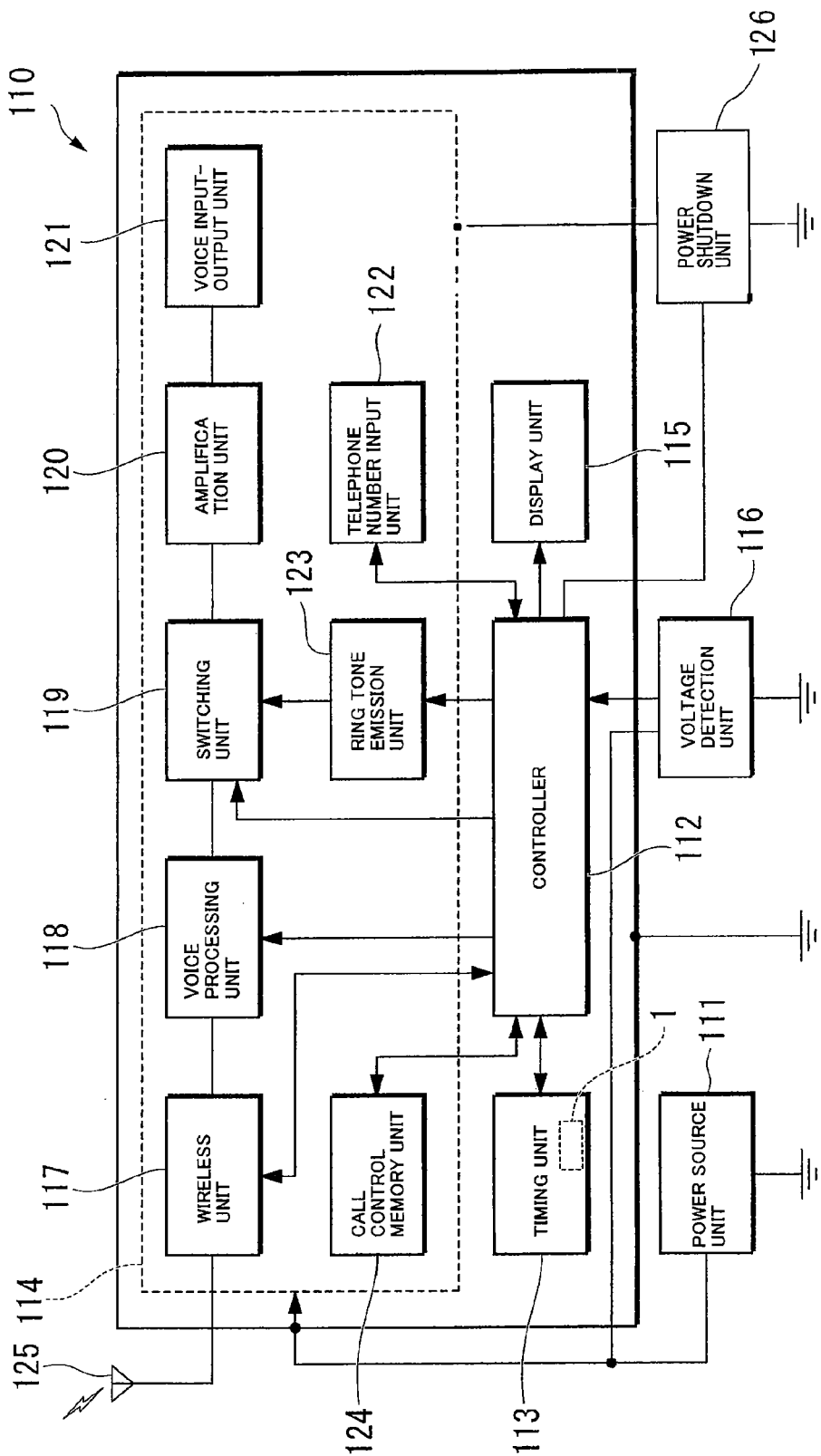
FIG. 16 is a configuration diagram showing an embodiment of electronic equipment according the invention.

Next, an embodiment of the electronic equipment according to the invention will be explained with reference to FIG. 16. In addition, as the electronic equipment, portable information equipment 110 having the above-mentioned piezoelectric vibrator 1 will be explained as an example. Firstly, the portable information equipment 110 of the present embodiment is represented by, for example, a mobile phone, and is one in which a wrist watch in the related art is developed and improved. The exterior thereof is similar to the wrist watch, where a liquid crystal display is arranged on a portion equivalent to the hour plate, and the present time or the like can be displayed on the screen. Furthermore, when it is used as a communicator, it can be separated from the wrist and can perform the same communication as the mobile phone of the related art by a speaker and a microphone built in an inner portion of the band. However, as compared to the mobile phone of the related art, it is radically miniaturized and lightened.

Next, the configuration of the portable information equipment 110 of the present embodiment will be explained. As shown in FIG. 16, the portable information equipment 110 includes the piezoelectric vibrator 1 and a power source portion 111 for supplying the electric power. The power source portion 111 includes, for example, a lithium secondary battery. A control portion 112 which performs various controls, a measurement portion 113 performing the count of the time or the like, a communication portion 114 performing the communication with the outside, a display portion 115 displaying various information, and a voltage detection portion 116 detecting the voltage of the respective functional portions are connected to the power source portion 111 in parallel. Moreover, the respective functional portions are provided with the electric power by the power source portion 111.

The control portion 112 controls the respective functional portions to perform the motion control of the whole system such as the transmission and the reception of the sound data, or the measurement or the display of the current time. Furthermore, the control portion 112 includes a ROM with a program written thereon in advance, a CPU that reads and executes the program written on the ROM, and a RAM or the like used as a work area of the CPU.

The measurement portion 113 includes an integrated circuit, which is equipped with an oscillation circuit, a register circuit, a counter circuit, interface circuit or the like, and the piezoelectric vibrator 1. When the voltage is applied to the piezoelectric vibrator 1, the piezoelectric vibrating reed 4 is vibrated and the vibration is converted to the electric signal by the piezoelectric property of crystal, and is input to the oscillation circuit as the electric signal. The output of the oscillation circuit is binarized and is counted by the register circuit and the counter circuit. Moreover, the signal is transmitted to and received from the control portion 112 via the interface circuit, and the current time, the current date, the calendar information or the like is displayed on the display portion 115.

The communication portion 114 has the same function as the mobile phone of the related art, and includes a wireless portion 117, a sound processing portion 118, a switch-over portion 119, an amplification portion 120, a sound input and output portion 121, a phone number input portion 122, a receiving sound generation portion 123, and a call control memory portion 124.

The wireless portion 117 performs the exchange of the transmission and the reception of various data such as sound data with a base station via an antenna 125. The sound processing portion 118 encodes and decodes the sound signal input from the wireless portion 117 or the amplification portion 120. The amplification portion 120 amplifies the signal, which is input from the sound processing portion 118 or the input and output portion 121, to a predetermined level. The sound input and output portion 121 includes a speaker, a microphone or the like, amplifies the receiving sound or the receipt sound, or collect the sound.

Furthermore, the receiving sound generation portion 123 creates the receiving sound according to calls from the base station. The switch-over portion 119 switches the amplification portion 120 connected to the sound processing portion 118 to the receiving sound generation portion 123 only when receiving, whereby the receiving sound created in the receiving sound generation portion 123 is output to the sound input and output portion 121 via the amplification portion 120. In addition, the call control memory portion 124 stores the program relating to the departure and the arrival of the communication. Furthermore, the phone number input portion 122 includes, for example, number keys from 0 to 9 and other keys, and by pushing the number keys or the like, the phone number of the call destination or the like is input.

The voltage detection portion 116 detects the voltage drop and notifies it to the control portion 112 when the voltage added to the respective function portions such as the control portion 112 by the power source portion 111 is lower than a predetermined value. The predetermined voltage value of this time is a value which is preset as a minimum voltage necessary for stably operating the communication portion 114, and, for example, is about 3V. The control portion 112 receiving notification of a voltage drop from the voltage detection portion 116 prohibits the operation of the wireless portion 117, the sound processing portion 118, the switch-over portion 119 and the receiving sound generation portion 123. Particularly, stopping the operation of the wireless portion 117 having a high rate of electric power consumption is essential. Furthermore, the intent that the communication portion 114 becomes unusable due to the lack of the battery residual quantity is displayed on the display portion 115.

That is, the operation of the communication portion 114 can be prohibited by the voltage detection portion 116 and the control portion 112 and the intent can be displayed on the display portion 115. The display may be a text message, but as a more intuitive display, an X (cross) display may be made on a phone icon displayed on the upper portion of the display surface of the display portion 115. In addition, the power source shut-off portion 126 which can selectively shut off the power source of the portion relating to the function of the communication portion 114 is included, whereby the function of the communication portion 114 can further reliably be stopped.

As mentioned above, according to the portable information equipment 110 of the present embodiment, since it includes the piezoelectric vibrator 1 whose quality is improved by the minute regulation of the frequency with a high accuracy while reducing the accumulation of stress by heat, and which has a stable vibration characteristic due to the efficient gettering and minute regulation, the portable information equipment 110 itself also can promote high quality. Additionally, it is possible to display the high precision timepiece information which is stable for a long period of time.

(Radio-Controlled Timepiece)

Figure 17:
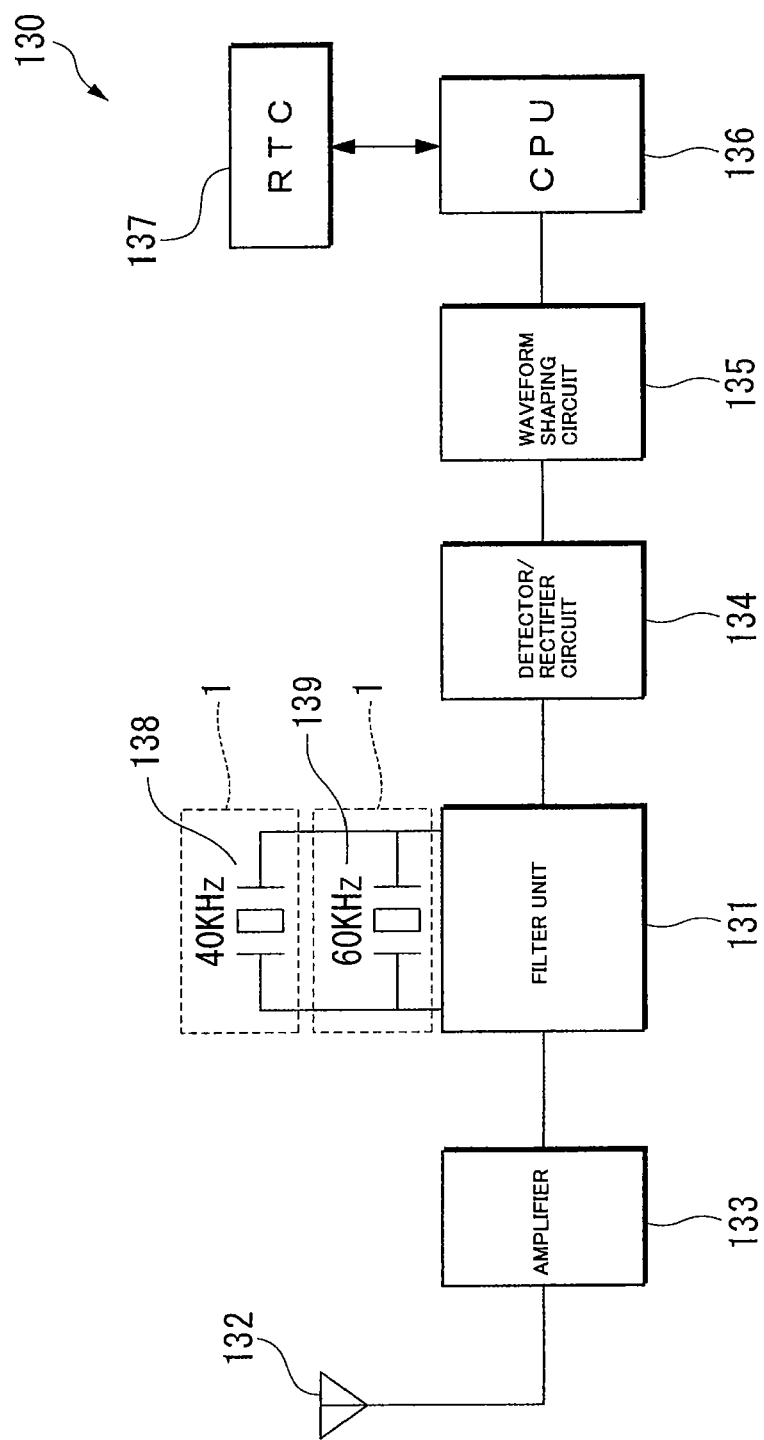
FIG. 17 is a configuration diagram showing an embodiment of a radio-controlled timepiece according to the invention.
Figure 18:
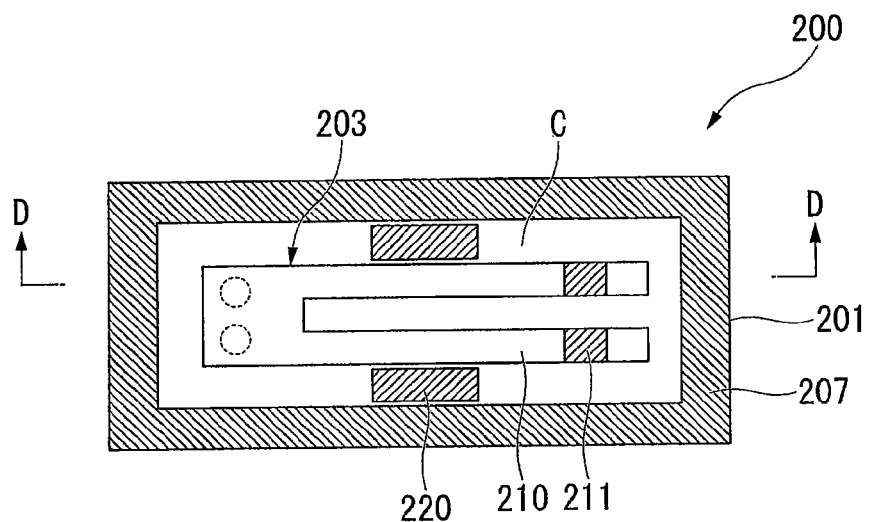
FIG. 18 is a plane view of a state in which the lid substrate of the piezoelectric vibrator according to the related art is removed.
Figure 19:
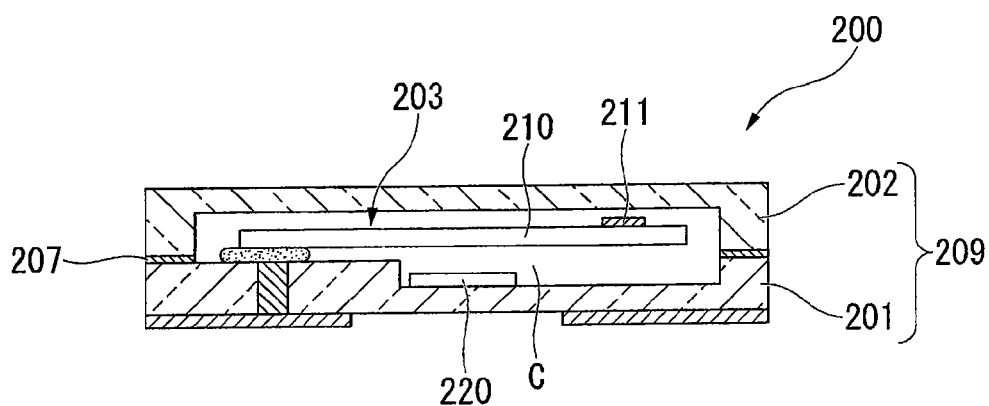
FIG. 19 is a cross-sectional view taken along line D-D of FIG. 18.

Next, an embodiment of a radio-controlled timepiece according to the invention will be explained with reference to FIG. 17. As shown in FIG. 17, a radio-controlled timepiece 130 of the present embodiment is a timepiece which includes the piezoelectric vibrator 1 that is electrically connected to a filter portion 131 and includes the function of receiving standard radio waves including the timepiece information and automatically correcting and displaying the same as the correct time.

In Japan, transmitting stations for transmitting standard radio waves exist in Fukushima prefecture (40 KHz) and Saga prefecture (60 KHz), and each transmits the standard radio waves, respectively. Since long waves such as 40 KHz or 60 KHz have a property of spreading across the surface of the earth and a property of spreading while reflecting between the ionization layer and the ground of the earth, the spreading range is wide, and the above-mentioned two transmitting stations cover the whole of Japan.

Hereinafter, a functional configuration of the radio-controlled timepiece 130 will be explained in detail.

An antenna 132 receives the standard radio waves of the long waves at 40 KHz or 60 KHz. The standard radio waves of the long waves apply an AM modulation to the transport waves of 40 KHz or 60 KHz in a time information called a time code. The standard radio waves of the received long waves are amplified by an amp 133 and are filtered and tuned by a filter portion 131 having a plurality of piezoelectric vibrators 1. The piezoelectric vibrator 1 of the present embodiment includes crystal vibrator portions 138 and 139 having the same resonant frequencies of 40 KHz and 60 KHz as the transport frequency, respectively.

In addition, the signal of the filtered predetermined frequency is detected and demodulated by a detection and rectifier circuit 134. Next, the time code is taken out via a wave shaping circuit 135 and is counted by a CPU 136. In the CPU 136, information such as current year, accumulated date, day of the week, and time is read. The read information is reflected in an RTC 137 and the correct time information is displayed. Since the transport waves are 40 KHz or 60 KHz, a vibrator having the above-mentioned tuning fork type structure is suitable for the crystal vibrator portions 138 and 139.

In addition, the aforementioned explanation was shown by an example in Japan, but the frequencies of the standard radio waves of the long waves differ in foreign countries. For example, standard radio waves of 77.5 KHz are used in Germany. Thus, in a case where the radio-controlled timepiece 130 capable of coping in foreign countries is built in a mobile phone, there is a need for the piezoelectric vibrator 1 having a different frequency from the case in Japan.

As mentioned above, according to the radio-controlled timepiece 130 of the present embodiment, since it includes the piezoelectric vibrator 1 whose quality is improved by the minute regulation of the frequency with a high accuracy while reducing the accumulation of stress by heat, and which has a stable vibration characteristic due to the efficient gettering and minute regulation, the radio-controlled timepiece 130 itself can also promote high quality. Additionally, it is possible to stably and accurately count the time over a long period of time.

In addition, the technical scope of the invention is not limited to the above embodiments but various modifications can be added within a scope without departing from the gist of the invention.

For example, in the above-mentioned embodiment, the piezoelectric vibrator 1 is an SMD type piezoelectric vibrator 1 of a two layer structure type, but it may be a piezoelectric vibrator of a three layer structure type without being limited thereto. That is, a piezoelectric vibrator plate is mounted on the upper surface of the base substrate 2 using the piezoelectric vibrator plate having a frame shape portion surrounding the periphery of the piezoelectric vibrating reed 4, the base substrate 2 and the lid substrate 3 are bonded to each other via the piezoelectric vibrator plate, and the piezoelectric vibrating reed 4 is sealed in the cavity C, thereby forming the piezoelectric vibrator.

Moreover, in the above-mentioned embodiment, the minute regulation film 21b is formed as the weight metal film 21 and the minute regulation film 21b is heated, thereby performing the minute regulation process, but it is not limited thereto. For example, the excitation electrode 15 may be formed on the front end sides of the pair of vibration arm portions 10 and 11 so as to extend up to near the rough regulation film 21a, and a part of the excitation electrode 15 is heated, thereby performing the minute regulation process. That is, in this case, a part of the excitation electrode 15 functions as the weight metal film 21.

Furthermore, in the above-mentioned embodiment, the case of forming the getter material 34 on the base substrate 2 is explained as an example, but the getter material 34 may be formed on at least substrate of the base substrate 2 and the lid substrate 3. That is, the getter material 34 may be formed on the lid substrate 3 and may be formed on both substrates 2 and 3.

Furthermore, in the above-mentioned embodiments, as an example of the piezoelectric vibrating reed 4, the piezoelectric vibrating reed 4 with the grooves in which the groove portions 18 are formed on both surfaces of the vibration arm portions 10 and 11 is described but it may be a type of piezoelectric vibrating reed without the groove portions 18. However, by forming the groove portions 18, when a predetermined voltage is applied to the pair of excitation electrodes 15, the electric field efficiency between the pair of excitation electrodes 15 can be improved, which can further suppress the vibration loss and further improve the vibration property. That is, the CI value (Crystal Impedance) can be further reduced and the high performance of the piezoelectric vibrating reed 4 can be further promoted. Given this point, it is desirable to form the groove portions 18.

Furthermore, in the above-mentioned embodiments, the pair of through electrodes 33 and 34 is formed, the invention is not limited thereto. However, in the case of manufacturing the piezoelectric vibrator 1 using the wafer, since the respective piezoelectric vibrating reeds 4 can be vibrated by the wafer shape by forming the through electrodes 33 and 34, the gettering process and the minute regulation process can be performed before forming the small pieces. Accordingly, it is desirable to form the through electrodes 33 and 34.

Moreover, in the above-mentioned embodiment, the piezoelectric vibrating reed 4 is bump-bonded, the invention is not limited to bump-bonding. For example, the piezoelectric vibrating reed 4 may be bonded by a conductive adhesive. However, the piezoelectric vibrating reed 4 can float from the upper surface of the base substrate 2 by the bump-bonding, whereby it is possible to naturally secure the minimum vibration gap that is necessary for the vibration. Thus, it is desirable to perform the bump-bonding.

Furthermore, in the above-mentioned embodiment, the description has been given of a case where the base substrate wafer 40 is moved in the state of fixing the laser beam source device, thereby irradiating a desired position of the getter material 34 with laser beam. However, on the other hand, the base substrate wafer 40 may be fixed and the getter material 34 may be irradiated with laser beam while moving the laser beam source device.

INDUSTRIAL APPLICABILITY

The method of manufacturing the piezoelectric vibrator according to the invention can be applied to a Surface Mount Device (SMD) type piezoelectric vibrator in which the piezoelectric vibrating reed is sealed in the cavity formed between the two bonded substrates.

What is claimed is:

1. A method of manufacturing a piezoelectric vibrator, the method comprising:
   providing a tuning fork type piezoelectric vibrating reed including a pair of vibration arm portions;
   providing a package that accommodates the piezoelectric vibrating reed; and
   forming a pair of regulation films on as substrate within the package in parallel to a longitudinal direction of the vibration arm portions such that the pair of vibration arm portions are positioned between the pair of regulation films,
   the piezoelectric vibrator being capable of regulating a degree of vacuum in the package more than a certain level by irradiating the regulation films with laser to evaporate a part of the regulation films,
   irradiating, using a laser, the pair of regulation films in symmetrical positions via a center axis of the pair of vibration arm.

2. A piezoelectric vibrator comprising:
   a tuning fork type piezoelectric vibrating reed that includes a first vibration arm portion and a second vibration arm portion;
   a package that accommodates the piezoelectric vibrating reed; and
   a first regulation film formed along a longitudinal direction of the first vibration arm portion along an outside edge of the first vibration arm portion;
   a second regulation film formed along a longitudinal direction of the second vibration arm portion along au outside edge of the second vibration arm portion, such that along a direction perpendicular to the longitudinal direction, the first and second vibration arm portions are positioned between first and second regulation films,
   the piezoelectric vibrator being capable of improving a degree of vacuum in the package by irradiating the regulation films with a laser to evaporate a part of the regulation films, wherein an irradiation trace of a laser is formed in symmetrical positions via a center axis of the pair of vibration arm portions in the pair of regulation films.

3. An oscillator comprising a piezoelectric vibrator according to claim 2 that is electrically connected to an integrated circuit as an oscillating element.

4. Electronic equipment comprising a piezoelectric vibrator according to claim 2 that is electrically connected to a measurement portion.

5. A radio-controlled timepiece comprising a piezoelectric vibrator according to claim 2 that is electrically connected to a filter portion.

* * * * *